United States Patent
Huang

(12) 
(10) Patent No.: US 11,296,042 B2
(45) Date of Patent: Apr. 5, 2022

(54) TRIODE PACKAGING METHOD AND TRIODE

(71) Applicant: SHENZHEN SIPTORY TECHNOLOGIES CO., LTD, Guangdong (CN)

(72) Inventor: Mian Huang, Guangdong (CN)

(73) Assignee: SHENZHEN SIPTORY TECHNOLOGIES CO., LTD, Shenzhen (CN)

( * ) Notice: Subject to any disclaimer, the term of this patent is extended or adjusted under 35 U.S.C. 154(b) by 41 days.

(21) Appl. No.: 16/900,380

(22) Filed: Jun. 12, 2020

(65) Prior Publication Data
US 2020/0312799 A1    Oct. 1, 2020

Related U.S. Application Data

(63) Continuation of application No. PCT/CN2017/117771, filed on Dec. 21, 2017.

(30) Foreign Application Priority Data

Dec. 22, 2016  (CN) .......................... 201611202022.1
Dec. 22, 2016  (CN) .......................... 201611202117.3
Dec. 22, 2016  (CN) .......................... 201611205111.1

(51) Int. Cl.
*H01L 23/00*    (2006.01)

(52) U.S. Cl.
CPC ............. *H01L 24/03* (2013.01); *H01L 24/05* (2013.01); *H01L 24/19* (2013.01); *H01L 24/20* (2013.01); *H01L 2224/03462* (2013.01)

(58) Field of Classification Search
CPC ......... H01L 24/03; H01L 24/05; H01L 24/19; H01L 24/20; H01L 2224/03462
(Continued)

(56) References Cited

U.S. PATENT DOCUMENTS

2010/0157568 A1*  6/2010  Ewe .................. H01L 23/49827
                                                              361/820
2013/0049214 A1*  2/2013  Nikitin .................... H01L 24/20
                                                              257/774
2013/0292684 A1*  11/2013  Nikitin .................... H01L 23/50
                                                              257/76

FOREIGN PATENT DOCUMENTS

CN     102386105 A     3/2012
CN     102751254 A     10/2012
(Continued)

OTHER PUBLICATIONS

International search report of PCT Patent Application No. PCT/CN2017/117771 dated Mar. 30, 2018.

*Primary Examiner* — Didarul A Mazumder

(57) ABSTRACT

Disclosed are a triode packaging method and a triode. The method includes: providing a carrier, and covering at least one surface of the carrier with a surface metal layer; covering a circuit pattern region of the surface metal layer with a resist film; electroplating a non-circuit pattern region of the surface metal layer, to form at least one first bonding pad; welding a chip on the at least one first bonding pad; welding a second bonding pad on the chip to form a triode template; performing plastic packaging on the triode template by using a composite material; drilling blind holes in vertical directions of the second bonding pad and the at least one first bonding pad, and processing the blind holes into metallic blind holes; and performing pattern fabrication on the metallic blind holes to form a closed-circuit loop or a non-closed-circuit loop, and obtaining a triode through packaging.

20 Claims, 5 Drawing Sheets

(58) Field of Classification Search
USPC .................. 257/734, 735; 438/411, 461, 611
See application file for complete search history.

(56) References Cited

FOREIGN PATENT DOCUMENTS

| | | |
|---|---|---|
| CN | 102768960 A | 11/2012 |
| CN | 103400770 A | 11/2013 |
| CN | 103635996 A | 3/2014 |
| CN | 104576421 A | 4/2015 |
| JP | H01228139 A | 9/1989 |
| JP | 2006134914 A | 5/2006 |
| JP | 2008103382 A | 5/2008 |

* cited by examiner

TRIODE PACKAGING METHOD AND TRIODE

CROSS REFERENCE TO RELATED APPLICATIONS

The present application is a Continuation Application of PCT Application No. PCT/CN2017/117771 filed on Dec. 21, 2017, which claims the benefit of Chinese Patent Application Nos. 201611205111.1, 201611202022.1 and 201611202117.3 filed on Dec. 22, 2016. All the above are hereby incorporated by reference.

TECHNICAL FIELD

The present invention relates to the field of triodes, and specifically, to a triode packaging method and a triode.

BACKGROUND ART

As electronic products develop toward miniaturization, integration, and popularization, triodes used in the electronic products are accordingly miniaturized.

At present, the triodes use traditional packaging methods. For example, a chip is packaged into a triode with a certain function by means of wire bonding (WB).

However, for some miniaturized electronic products integrated with some triodes, the triode obtained through packaging by means of wire bonding occupies large space and has low packaging efficiency.

SUMMARY

Embodiments of the present invention provide a triode packaging method and a triode, to resolve problems of large occupied space and low packaging efficiency of an existing triode.

A first aspect of the present invention provides a triode packaging method, including:
 providing a carrier, and covering at least one surface of the carrier with a surface metal layer;
 covering a circuit pattern region of the surface metal layer with a resist film;
 electroplating a non-circuit pattern region of the surface metal layer, to form at least one first bonding pad;
 welding a chip on the at least one first bonding pad;
 welding at least two second bonding pads on the chip to form a triode template;
 performing plastic packaging on the triode template by using a composite material;
 drilling blind holes in vertical directions of the second bonding pad and the at least one first bonding pad, and processing the blind holes into metallic blind holes; and
 performing pattern fabrication on the metallic blind holes to form a closed-circuit loop or a non-closed-circuit loop, and obtaining a triode through packaging.

The carrier is provided. The carrier is a laminate with two-layer copper foil, an upper layer of the two-layer copper foil is ultrathin copper foil (having a thickness of less than 7 μm, where a preferable thickness ranges from 1 μm to 3 μm, and another preferable thickness ranges from 3 μm to 5 μm), a lower layer of the copper foil is conventional copper foil (having a thickness ranging from 10 μm to 50 μm, where a preferable thickness ranges from 30 μm to 40 μm), there is a certain viscosity between the two layers of copper foil, the two layers can also be relatively easily stripped, and the lower layer of the copper foil is closely combined with the laminate. The surface metal layer an ultrathin copper foil layer. In addition, during actual production, two-layer copper foil may also exist on both sides of the laminate, to improve production efficiency.

In some possible implementations, the covering a circuit pattern region of the surface metal layer with a resist film includes:
 coating the surface metal layer with a resist film; and
 removing a resist film of the non-circuit pattern region by using exposure and development steps, so that a reserved resist film covers the circuit pattern region.

In some possible implementations, before the welding a chip on the at least one first bonding pad, the packaging method further includes:
 removing the resist film of the circuit pattern region.

In some possible implementations, the welding a chip on the at least one first bonding pad includes:
 placing the chip on the at least one first bonding pad, and welding the chip on the at least one first bonding pad in at least one manner of solder paste, tin plating, metal bonding, and conductive adhesive bonding.

In some possible implementations, the welding a second bonding pad on the chip to form a triode template includes:
 electroplating a target region of the chip, to form a second bonding pad.

In some possible implementations, the drilling blind holes in vertical directions of the second bonding pad and the at least one first bonding pad includes:
 drilling the blind holes in the vertical directions of the second bonding pad and the at least one first bonding pad by using a laser blind hole.

The processing the blind holes into metallic blind holes includes:
 processing the blind holes into the metallic blind holes in at least one manner of eletcroless plating copper, electro-coppering, sputtered copper, and a conductive copper adhesive.

In some possible implementations, after the performing pattern fabrication on the metallic blind holes to form a closed-circuit loop or a non-closed-circuit loop, the packaging method further includes:
 adding the composite material to a mold and performing plastic packaging, to cut off an excess composite material.

In some possible implementations, the packaging method further includes:
 welding a target electronic component on the at least one first bonding pad, where the target electronic component includes at least one of a resistor and a capacitor.

A second aspect of the present invention provides a triode, where the triode is a triode obtained through packaging in any one of the first aspect or the packaging methods in the first aspect.

A third aspect of the present invention provides a triode packaging method, including: providing a carrier, and covering at least one surface of the carrier with a surface metal layer; covering some regions of the surface metal layer with a protective film; electroplating a region that is not covered with the protective film and that is of the surface metal layer, to form at least one first bonding pad; welding a chip on the at least one first bonding pad; welding a second bonding pad on the chip to form a triode template; performing plastic packaging on the triode template by using a composite material; drilling blind holes in vertical directions of the second bonding pad and the at least one first bonding pad, and processing the blind holes into metallic blind holes; and performing pattern fabrication on the metallic blind holes to form a closed-circuit loop or a non-closed-circuit loop, and obtaining a triode through packaging.

Preferably, the protective film is an anti-coating film; the region that is not covered with the protective film is a conductive circuit region; the conductive circuit region includes only a bonding pad, or the conductive circuit region includes a bonding pad and a connection cable; the surface metal layer has a thickness of less than 7 μm, and an electroplated coating of the at least one first bonding pad has a thickness of greater than 5 μm; the welding a chip on the at least one first bonding pad includes: there are two first bonding pads, and the two first bonding pads are respectively welded to one electrode of the triode chip; or there is one first bonding pad, and the one first bonding pad is welded to one electrode of the triode chip; the welding a second bonding pad on the chip to form a triode template includes: the second bonding pad is located at the other two electrodes or the other one electrode of the triode chip.

Preferably, the packaging method further includes: stripping the carrier from a bottom portion of the surface metal layer; and etching the surface metal layer, where the region that is covered with the protective film and that is of the surface metal layer is etched; the surface metal layer whose region is not covered with the protective film is etched, or the surface metal layer whose region is not covered with the protective film and the electroplated conductive circuit region are reserved.

Preferably, the carrier is a laminate with two-layer copper foil, an upper layer of the two-layer copper foil is a surface metal layer, a lower layer of the copper foil is conventional copper foil with a thickness of 10 μm to 50 μm, there is a certain viscosity between the two layers of copper foil, the two layers can also be relatively easily stripped, and the lower layer of the copper foil is closely combined with the laminate.

A fourth aspect of the present invention provides a triode packaging method, including: providing a carrier, and covering at least one surface of the carrier with a surface metal layer; covering some regions of the surface metal layer with a protective film; electroplating a region that is not covered with the protective film and that is of the surface metal layer, to form a first bonding pad; welding a triode chip on the first bonding pad; and laminating, with other circuit layers by using a lamination process, the carrier and the surface metal layer on which the triode chip is welded.

Preferably, the protective film is an anti-coating film; the region that is not covered with the protective film is a conductive circuit region; the conductive circuit region includes only a bonding pad, or the conductive circuit region includes a bonding pad and a connection cable; the surface metal layer has a thickness of less than 7 μm, and an electroplated coating of the at least one first bonding pad has a thickness of greater than 5 μm; the welding a triode chip on the first bonding pad includes: there are two first bonding pads, and the two first bonding pads are respectively welded to one electrode of the triode chip; or there is one first bonding pad, and the one first bonding pad is welded to one electrode of the triode chip.

Preferably, after the laminating, with other circuit layers, the carrier and the surface metal layer on which the triode chip is welded, the method further includes: connecting the other one or two electrodes of the triode to any one of the other circuit layers by using a blind hole process.

Preferably, after the laminating, with other circuit layers, the carrier and the surface metal layer on which the triode chip is welded, the method further includes: stripping the carrier from a bottom portion of the surface metal layer; and etching the surface metal layer, where the region that is covered with the protective film and that is of the surface metal layer is etched; the surface metal layer whose region is not covered with the protective film is etched, or the surface metal layer whose region is not covered with the protective film and the electroplated conductive circuit region are reserved.

Preferably, the carrier is a laminate with two-layer copper foil, an upper layer of the two-layer copper foil is a surface metal layer, a lower layer of the copper foil is conventional copper foil with a thickness of 10 μm to 50 μm, there is a certain viscosity between the two layers of copper foil, the two layers can also be relatively easily stripped, and the lower layer of the copper foil is closely combined with the laminate.

It may be seen from the foregoing technical solutions that the embodiments of the present invention have the following advantages:

Different from the prior art, packaging is performed for the triode in a manner replacing traditional wire bonding, the chip is welded to the bonding pad through welding or a blind hole connection, and the chip is packaged into a triode with a certain function. The triode obtained through packaging occupies small space, and an entire process procedure is simple, thereby effectively increasing packaging efficiency of the triode.

BRIEF DESCRIPTION OF THE DRAWINGS

To more clearly describe the technical solutions of the embodiments of the present invention, the accompanying drawings required to describe the embodiments are briefly described below. Apparently, the accompanying drawings described below are only some embodiments of the present invention. Those skilled in the art may further obtain other accompanying drawings based on these accompanying drawings without inventive effort.

DETAILED DESCRIPTION

Embodiments of the present invention provide a triode packaging method and a triode, to resolve problems of large occupied space and low packaging efficiency of an existing triode.

Technical solutions in the embodiments of the present invention will be clearly and completely described hereafter with reference to the accompanying drawings in the embodiments of the present invention. Apparently, the described embodiments are only some of the embodiments of the present invention, but not all the embodiments. All other embodiments obtained by a person skilled in the art based on the embodiments of the present invention without creative efforts shall fall within the protection scope of the present invention.

Terms "first", "second", "third", "fourth", and the like (if any) in the specification and claims of the present invention and the above accompanying drawings are used to distinguish similar objects without being used to describe a specific order or sequence. It should be understood that data used in such a way can be interchanged under an appropriate circumstance so that the embodiments described herein can be implemented in an order other than what is illustrated or described herein. In addition, terms "including", "having", and any variations thereof are intended to cover non-exclusive inclusions, for example, processes, methods, systems, products, or devices that contain a series of steps or units need not be limited to those clearly listed steps or units, but may include other steps or units not explicitly listed or inherent to these processes, methods, products, or devices.

Figure 1:
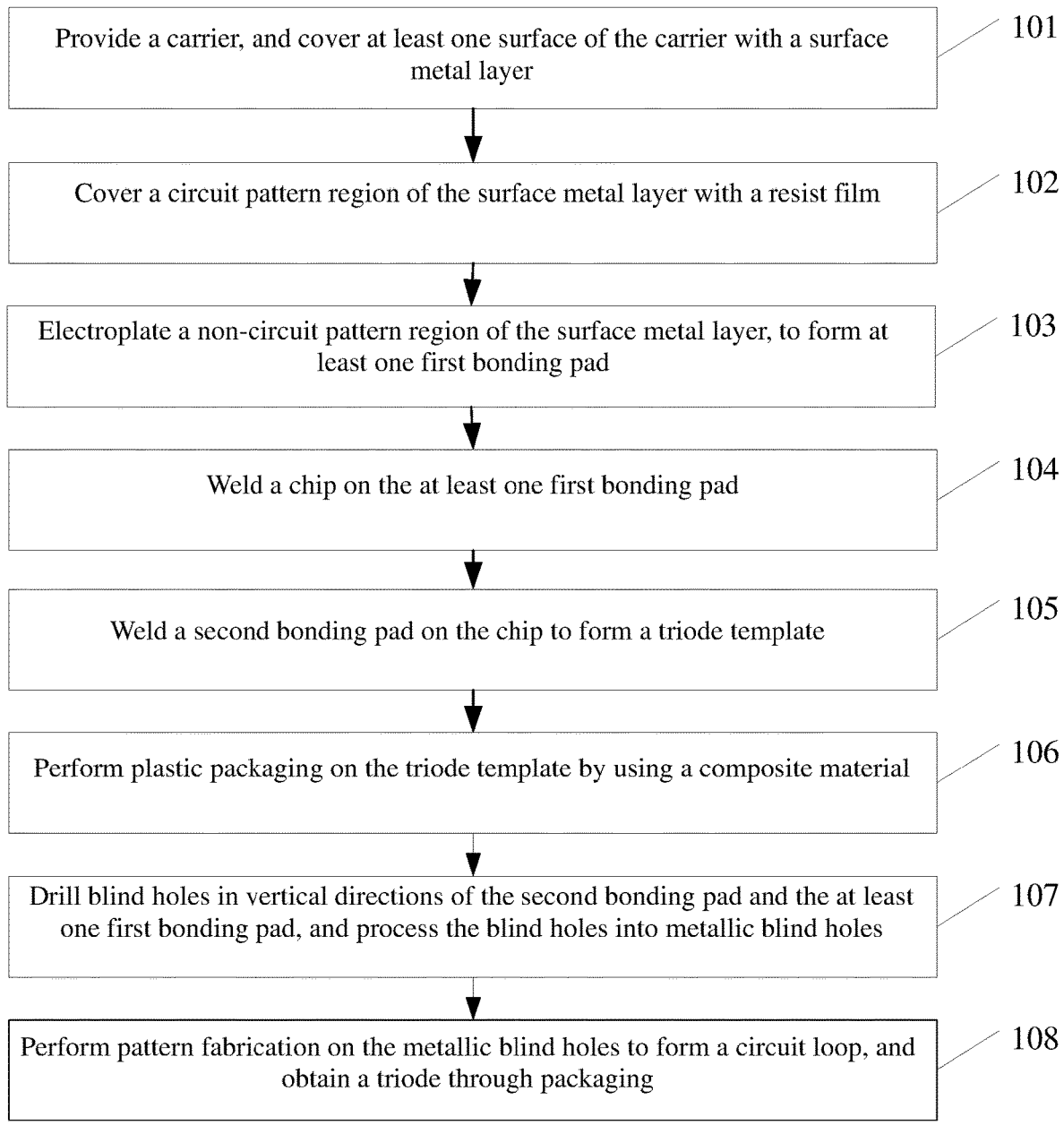
FIG. 1 is a schematic diagram of an embodiment of a triode packaging method according to the embodiments of the present invention.

FIG. 1 is a schematic diagram of an embodiment of a triode packaging method according to the embodiments of the present invention. A specific procedure of this embodiment is as follows.

Step 101: Provide a carrier, and cover at least one surface of the carrier with a surface metal layer.

When packaging is performed for a triode, the carrier for performing packaging for the triode is first provided. The carrier has strippability, thereby facilitating subsequent stripping. Therefore, the carrier may be considered as a medium in a triode packaging process, and the at least one surface of the carrier is covered with the surface metal layer. A carrier surface to be covered with the surface metal layer may be selected according to an actual requirement, and is not specifically limited herein. Usually, the surface metal layer is specifically a copper foil layer, or may certainly be another metal layer. This is not specifically limited herein.

Step 102: Cover a circuit pattern region of the surface metal layer with a resist film.

In this embodiment of the present invention, a region in which the surface metal layer is located includes the circuit pattern region and a non-circuit pattern region. The circuit pattern region needs to be covered with the resist film. Because the resist film is a polymer compound, a polymerization reaction can be produced after exposure (for example, ultraviolet irradiation) to form a stable substance attached to the circuit pattern region, to achieve functions of blocking electroplating and etching, thereby playing a role of protecting the circuit pattern region. During actual application, a location of the circuit pattern region is related to a shape, a structure, a circuit design, and the like of a specific product. This is not specifically described herein.

It should be noted that the resist film may be a dry film, a wet film, or another material with etching resistance. This is not specifically limited herein.

During actual application, there are a plurality of manners of covering the circuit pattern region of the surface metal layer with the resist film. In some possible implementations, the covering a circuit pattern region of the surface metal layer with a resist film includes: covering the surface metal layer with the resist film; removing a resist film of the non-circuit pattern region by using exposure and development steps, so that a reserved resist film covers the circuit pattern region.

Step 103: Electroplate the non-circuit pattern region of the surface metal layer, to form at least one first bonding pad.

In this embodiment of the present invention, the non-circuit pattern region of the surface metal layer is insulated and adiabatic, and is electroplated to obtain the at least one first bonding pad. A material of the first bonding pad is at least one of copper, nickel, gold, silver, tin, and lead, or at least one of alloys thereof. A height and location of the first bonding pad are related to an actual product. This is not specifically limited herein.

It should be noted that the first bonding pad in this embodiment of the present invention is used to distinguish from a second bonding pad, the material of the first bonding pad may be the same as or different from a material of the second bonding pad. This is not specifically limited herein.

Step 104: Weld a chip on the at least one first bonding pad.

During actual application, bonding pads of the triode may be in a horizontal location relationship or a vertical location relationship. In some possible implementations, before the chip is welded to the at least one first bonding pad, the resist film of the circuit pattern region needs to be removed, thereby facilitating welding the chip on the first bonding pad. The chip carries bonding pads on an upper surface and/or a lower surface welded to the bonding pad.

In some possible implementations, the welding a chip on the at least one first bonding pad includes: placing the chip on the at least one first bonding pad, and welding the chip on the at least one first bonding pad in at least one manner of solder paste, tin plating, metal bonding, and conductive adhesive bonding.

It should be noted that, in addition to at least one of the welding manners of solder paste, tin plating, metal bonding, and conductive adhesive bonding, or a combination thereof, another welding manner may be used. This not specifically limited herein.

Step 105: Weld the second bonding pad on the chip to form a triode template.

After the chip is welded on the at least one first bonding pad, the chip continues to be welded on the second bonding pad, so as to form the triode template. The material of the second bonding pad is at least one of copper, nickel, gold, silver, tin, and lead, or at least one of alloys thereof. A height and location of the second bonding pad are related to an actual product. This not specifically limited herein. If there are at least two first bonding pads, at least one second bonding pad needs to be welded on the chip. If there are at least one first bonding pad, at least two second bonding pads need to be welded on the chip.

In some possible implementations, the welding a second bonding pad on the chip to form a triode template includes: electroplating a target region of the chip, to form a second bonding pad, so that the triode template is formed. A location of the target region is related to an actual product, and the electroplating manner may be physical electroplating, eletcroless plating copper, or the like. In addition, besides the electroplating manner, the second bonding pad may be welded to the target region of the chip in at least one manner of solder paste, tin plating, metal bonding, and conductive adhesive bonding. Certainly, another welding manner may be further used. This is not specifically limited herein.

Step 106: Perform plastic packaging on the triode template by using a composite material.

In this embodiment of the present invention, plastic packaging needs to be performed on the triode template by using the composite material, so as to play a role of protecting the first bonding pad, the second bonding pad, and the chip. The composite material is at least one of a solid plastic packaging material, a powder plastic packaging material, liquid resin, semi-cured resin, and pure gum, or a combination thereof.

In some possible implementations, the performing plastic packaging on the triode template by using a composite material includes:

adding the composite material to a mold and performing plastic packaging.

Step 107: Drill blind holes in vertical directions of the second bonding pad and the at least one first bonding pad, and process the blind holes into metallic blind holes.

In some possible implementations, the drilling blind holes in vertical directions of the second bonding pad and the at least one first bonding pad includes: drilling the blind holes in the vertical directions of the second bonding pad and the at least one first bonding pad by using a laser blind hole.

The processing the blind holes into the metallic blind holes includes: processing the blind holes into the metallic blind holes in at least one manner of eletcroless plating copper, electrocoppering, sputtered copper, and a conductive copper adhesive, or a combination thereof.

Step 108: Perform pattern fabrication on the metallic blind holes to form a closed-circuit loop or a non-closed-circuit loop, and obtain a triode through packaging.

In this embodiment of the present invention, pattern fabrication is performed on the metallic blind holes to form the closed-circuit loop or the non-closed-circuit loop, to form inductance, so that the triode is obtained through packaging.

In some possible implementations, after the performing pattern fabrication on the metallic blind holes to form a closed-circuit loop or a non-closed-circuit loop, the composite material is added to the mold and plastic packaging is performed, to cut off an excess composite material.

During actual application, after the composite material is added to the mold, plastic packaging is performed according to a size of the mold, and the excess composite material is cut off according to a size and structure of the triode, to complete triode packaging. The composite material is at least one of resin, pure gum, and a prepreg, or a combination thereof.

In some possible implementations, a target electronic component may be further welded on the bonding pad, and the target electronic component includes at least one of a resistor and a capacitor.

During actual application, in the process of performing packaging for the triode, the electronic component such as a resistor, capacitor, connector, or spring is welded on the at least one first bonding pad, to effectively improve triode integration. In addition, the target electronic component is related to an actual product, and the electronic component and a quantity of electronic components can be determined according to the actual product. This is not specifically limited herein.

To better understand the technical solution provided in this embodiment of the present invention, the triode packaging process is described below by using a specific embodiment.

Figure 2A:
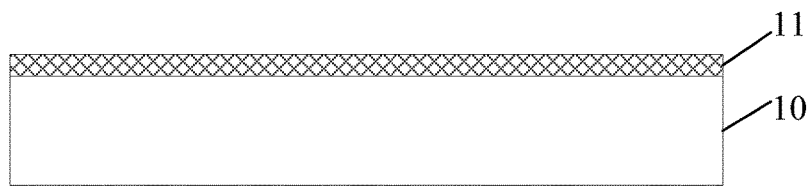
FIG. 2a is a schematic structural diagram of covering a carrier with a surface metal layer according to an embodiment of the present invention.

Referring to FIG. 2a, a carrier 10 is provided, and a surface of the carrier 10 is covered with a surface metal layer 11 to form a copper clad laminate. The copper clad laminate is used as a substrate for performing packaging for the triode. In addition, the carrier has strippability, and is used to strip the carrier after triode packaging is completed. Because metal copper has low costs, the surface metal layer is usually a copper foil layer, or may certainly be another metal layer. This is not specifically limited herein.

Figure 2B:
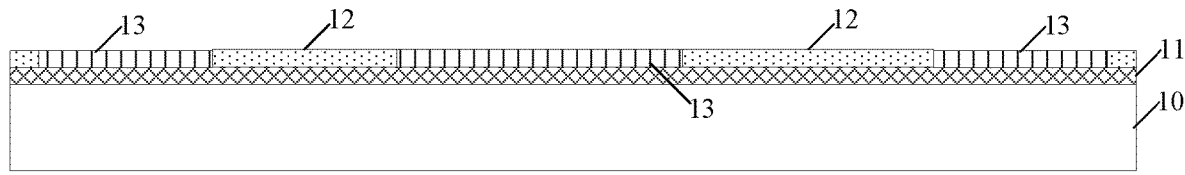
FIG. 2b is a schematic structural diagram of covering a surface metal layer with a resist film according to an embodiment of the present invention.

Referring to FIG. 2b, after the copper clad laminate is obtained through processing, the surface metal layer 11 is covered with a resist film 12. The resist film may be a dry film, or a wet film, or may be another material with etching resistance. Because the resist film has functions of light sensitivity and anti-corrosion, after exposure and development steps, a circuit pattern is transferred to the resist film. A resist film 12 of a non-circuit pattern region on the surface metal layer 11 is removed, so that only the resist film 12 on a circuit pattern region is reserved. Then the non-circuit pattern region of the surface metal layer is electroplated to obtain at least one first bonding pad 13. A size, height, and material of the first bonding pad are related to an actual product. This is not specifically limited herein. In addition, the electroplating manner may be physical electroplating or eletcroless plating copper. A specific electroplating principle is the following process: A thin layer of metal or alloys are plated on the surface metal layer in which the non-circuit pattern region is located, and a layer of metal film is attached to a surface of the metal or alloys through electrolysis.

Figure 2C:
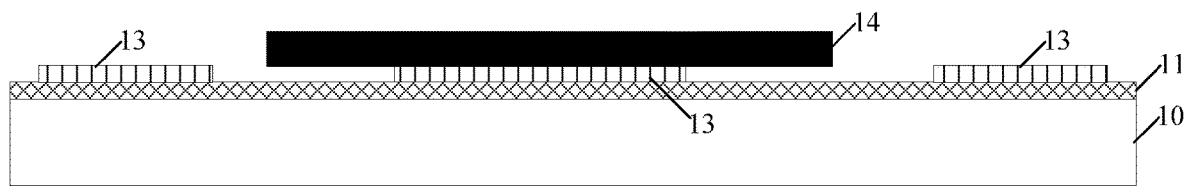
FIG. 2c is a structure structural diagram of welding a chip on a first bonding pad according to an embodiment of the present invention.

Referring to FIG. 2c, the resist film 12 on the circuit pattern region of the surface metal layer 11 is removed, and the chip 14 is welded on the at least one first bonding pad 13. The chip has its own bonding pad that is not shown in FIG. 2c. During actual application, the chip 14 is welded on the at least one first bonding pad 13 in at least one manner of solder paste, tin plating, metal bonding, and conductive adhesive bonding, or a combination thereof.

Figure 2D:
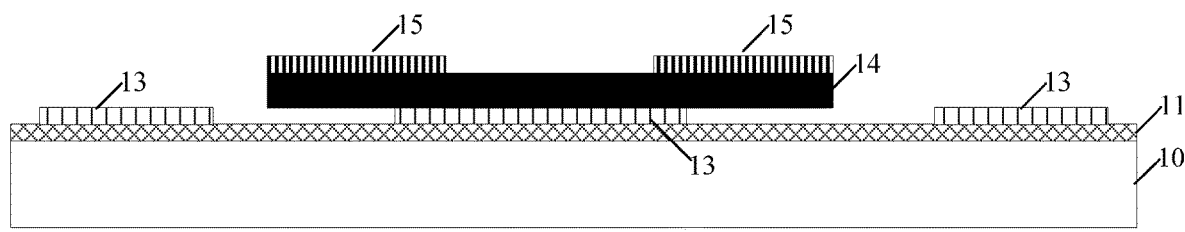
FIG. 2d is a schematic structural diagram of welding a second bonding pad on a chip according to an embodiment of the present invention.

Referring to FIG. 2d, a second bonding pad 15 is welded on the chip 14 to form a triode template. A specific process is as follows: A target region on the chip 14 is electroplated, to form the second bonding pad 15, where settings of the target region are related to an actual product. An electroplating manner may be physical electroplating, eletcroless plating copper, or the like. This is not specifically limited herein. It should be noted that, as shown in FIG. 2d, if there are at least two first bonding pads 13, at least one second bonding pad 15 needs to be welded on the chip. If there is at least one first bonding pad 13, at least two second bonding pads 15 need to be welded on the chip. This case is similar to FIG. 2d, and is not shown in the figure.

Figure 2E:
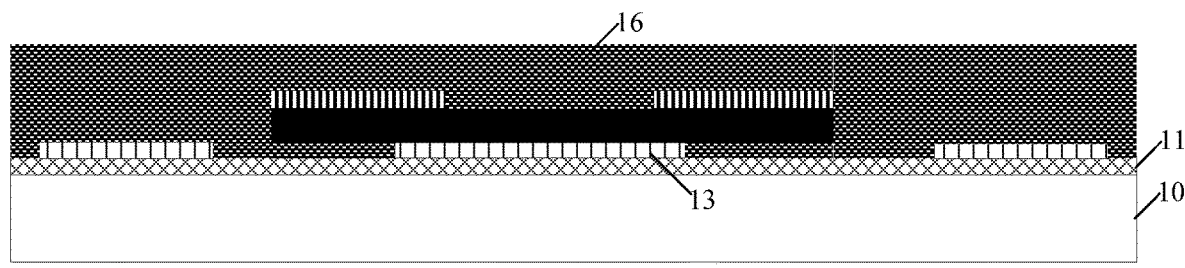
FIG. 2e is a schematic structural diagram of performing plastic packaging on a triode template according to an embodiment of the present invention.

Referring to FIG. 2e, plastic packaging is performed on the triode template by using a composite material 16. A specific process is as follows: The composite material 16 is added to a mold and plastic packaging is performed according a size required by the triode, to cut off an excess composite material. The composite material may be a solid or liquid plastic packaging material, such as pure gum or a prepreg.

Figure 2F:
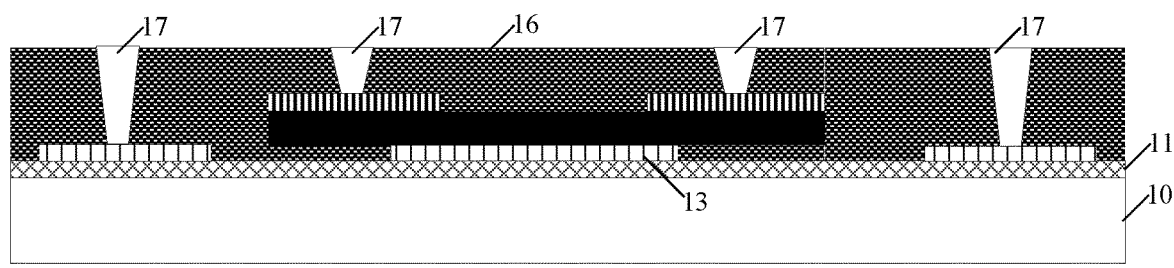
FIG. 2f is a schematic structural diagram of forming a metallic blind hole according to an embodiment of the present invention.

Referring to FIG. 2f, for a connection between circuits, blind holes 17 need to be drilled in vertical directions of the second bonding pad 15 and the at least one first bonding pad 13. During actual application, the blind holes 17 may be drilled by using a laser blind hole. Because the triode template is insulated and adiabatic, electroless plating copper and electroplating may be performed on the blind holes to make the drilled blind holes metallic, and pattern fabrication is performed on the metallic blind holes to form a closed-circuit loop or a non-closed-circuit loop, to form inductance. Then the composite material is added to a mold, plastic packaging is performed, and the excess composite material is cut off according to the size required by a triode. It should be noted that the composite material may be mechanically leveled, or the composite material may be smoothed through sanding. This is not specifically limited herein. Then the carrier 10 is removed, so as to complete packaging for the triode.

During actual application, an embodiment of the present invention further provides a triode. The triode is a triode obtained through packaging by using the packaging method shown in FIG. 1.

Figure 3:
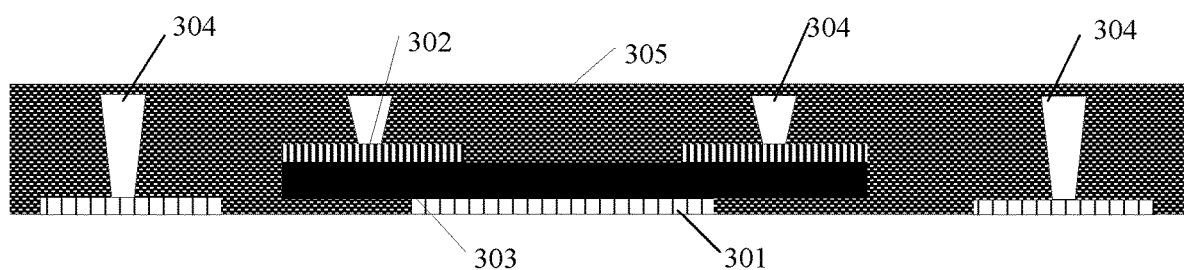
FIG. 3 is a schematic structural diagram of a triode according to an embodiment of the present invention.

FIG. 3 shows the triode obtained through packaging by using the packaging method shown in FIG. 1. The triode has at least three bonding pads. A first bonding pad 301 is located at a lower portion, and at least two second bonding pads 302 are located at an upper portion. A chip 303 is welded on the first bonding pad 301, and one surface of the chip 303 is welded to the at least two second bonding pads 302. Then plastic packaging is performed by using a composite material 305. Blind holes are drilled in vertical directions of the first bonding pad 301 and the second bonding pads 302 by using a laser blind hole, the blind holes are made metallic to form metallic blind holes 304, and pattern processing is performed on the metallic blind holes 304, to implement circuit communication. Certainly, during actual application, more chips or other electronic components such as a resistor and a capacitor may be further welded on the triode. This is not specifically limited herein. Then plastic packaging is performed by using the composite material 305, to protect the first bonding pad 301, the second bonding pads 302, and the chip 303.

Figure 4:
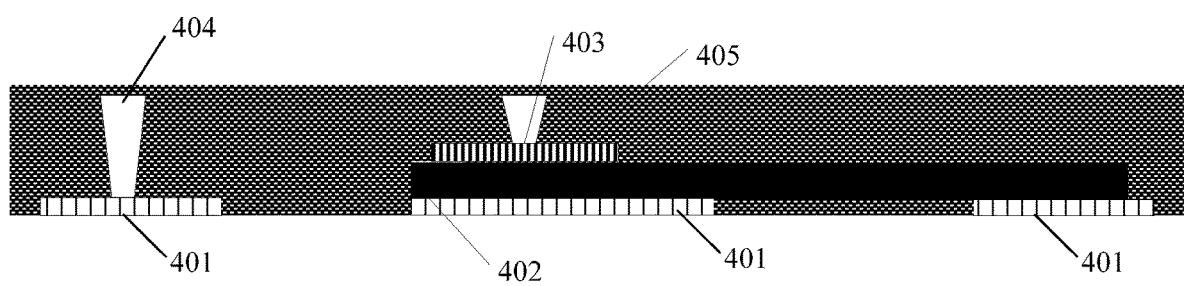
FIG. 4 is another schematic structural diagram of a triode according to an embodiment of the present invention.

FIG. 4 shows another triode obtained through packaging by using the packaging method shown in FIG. 1. The triode has at least three bonding pads. At least two first bonding pads 401 are located on a same horizontal plane, or are close to a same horizontal plane. A chip 402 is welded on the at least two first bonding pads 401. During actual application, more chips or other electronic components such as a resistor and a capacitor may be further welded on another first bonding pad, to improve triode packaging integration. One surface of the chip 402 is welded to at least one second bonding pad 403. Then plastic packaging is performed by using a composite material 405. Blind holes are drilled in vertical directions of the first bonding pad 401 and the second bonding pad 403 by using a laser blind hole, the blind holes are made metallic to form metallic blind holes 404, and pattern processing is performed on the metallic blind holes, to implement circuit communication. Then plastic packaging is performed again by using the composite material 405, to protect the first bonding pad 401, the chip 402, and the second bonding pad 403.

It should be noted that a size of the first bonding pad and a size of the second bonding pad required for performing packaging for the triode may be the same or different. The three bonding pads may not necessarily be located on a same horizontal line. This is not specifically limited herein.

Figure 5:
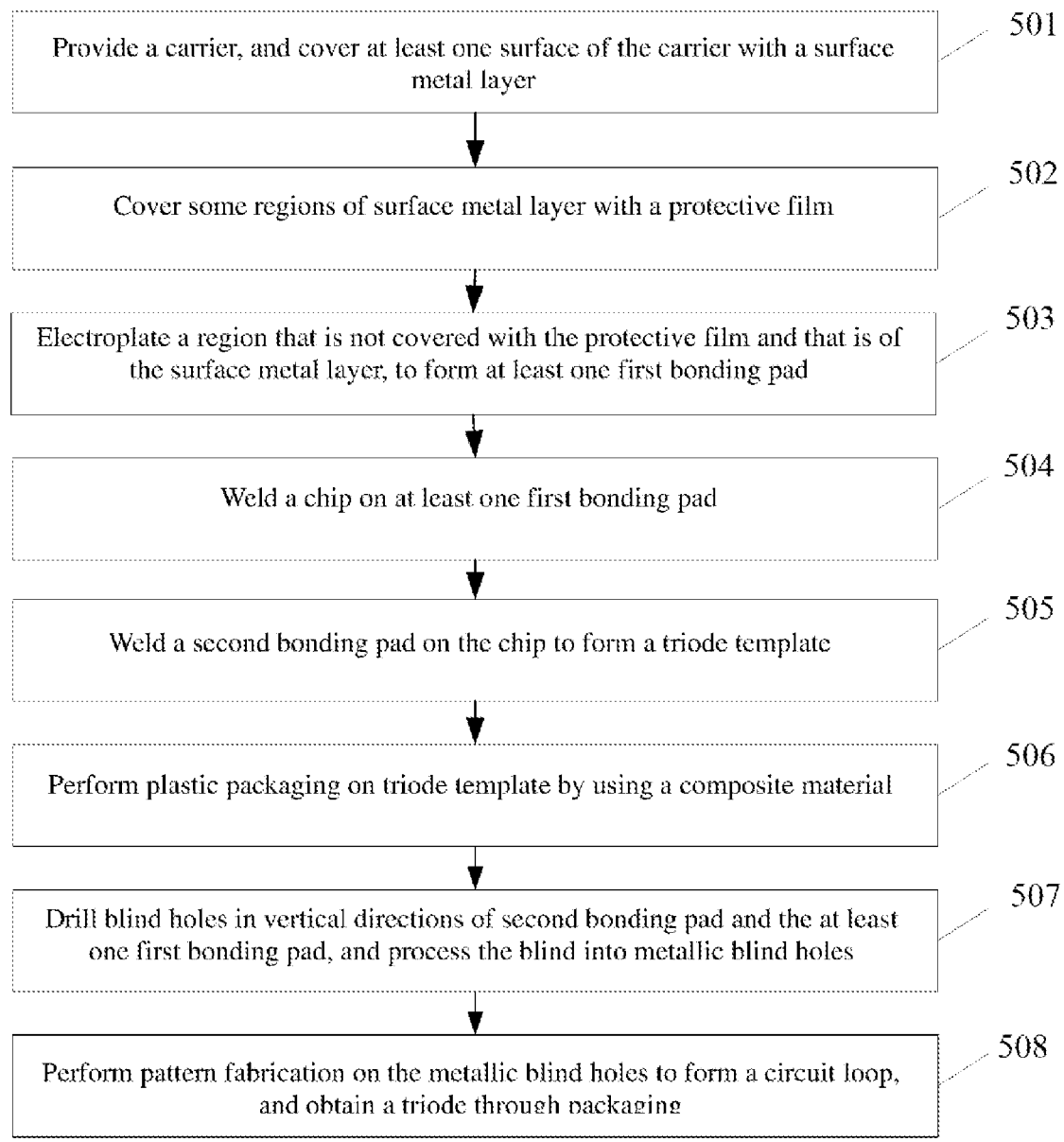
FIG. 5 is a schematic diagram of another embodiment of a triode packaging method according to the embodiments of the present invention.

FIG. 5 is a schematic diagram of another embodiment of a triode packaging method according to the embodiments of the present invention. A specific procedure of this embodiment is as follows:

Step 501. Provide a carrier, and cover at least one surface of the carrier with a surface metal layer.

Step 502. Cover some regions of the surface metal layer with a protective film.

Step 503. Electroplate a region that is not covered with the protective film and that is of the surface metal layer, to form at least one first bonding pad.

Step 504. Weld a chip on the at least one first bonding pad.

Step 505. Weld a second bonding pad on the chip to form a triode template.

Step 506: Perform plastic packaging on the triode template by using a composite material.

Step 507. Drill blind holes in vertical directions of the second bonding pad and the at least one first bonding pad, and process the blind holes into metallic blind holes.

Step 508. Perform pattern fabrication on the metallic blind holes to form a closed-circuit loop or a non-closed-circuit loop, and obtain a triode through packaging.

In this embodiment, the protective film is an anti-coating film;

the region that is not covered with the protective film is a conductive circuit region;

the conductive circuit region includes only a bonding pad, or the conductive circuit region includes a bonding pad and a connection cable;

the surface metal layer has a thickness of less than 7 μm, and an electroplated coating of the at least one first bonding pad has a thickness of greater than 5 μm;

the welding a chip on the at least one first bonding pad includes: there are two first bonding pads, and the two first bonding pads are respectively welded to one electrode of the triode chip; or there is one first bonding pad, and the one first bonding pad is welded to one electrode of the triode chip; and the welding a second bonding pad on the chip to form a triode template includes: the second bonding pad is located at the other two electrodes or the other one electrode of the triode chip.

In this embodiment, the packaging method further includes:

stripping the carrier from a bottom portion of the surface metal layer; and etching the surface metal layer, where the region that is covered with the protective film and that is of the surface metal layer is etched; the surface metal layer whose region is not covered with the protective film is etched, or the surface metal layer whose region is not covered with the protective film and the electroplated conductive circuit region are reserved.

In this embodiment, the carrier is a laminate with two-layer copper foil, an upper layer of the two-layer copper foil is ultrathin copper foil (having a thickness of less than 7 μm, where a preferable thickness ranges from 1 μm to 3 μm), a lower layer of the copper foil is conventional copper foil (having a thickness ranging from 10 μm to 50 μm, where a preferable thickness ranges from 30 μm to 40 μm), there is a certain viscosity between the two layers of copper foil, the two layers can also be relatively easily stripped, and the lower layer of the copper foil is closely combined with the laminate. The surface metal layer an ultrathin copper foil layer.

In addition, during actual production, two-layer copper foil may also exist on both sides of the laminate, to improve production efficiency.

In this embodiment, a method of using the ultrathin copper foil layer as an electroplating base layer for a bonding pad of a chip of a triode is initiated. The use of a laminate with two-layer copper foil as the carrier facilitates packaging of triodes in a circuit board production process. A concept of using a composite material for plastic packaging in a packaging factory greatly improves product efficiency, reduces a volume of a product obtained through packaging, and shortens a connection cable between the triode pad and the circuit.

Figure 6:
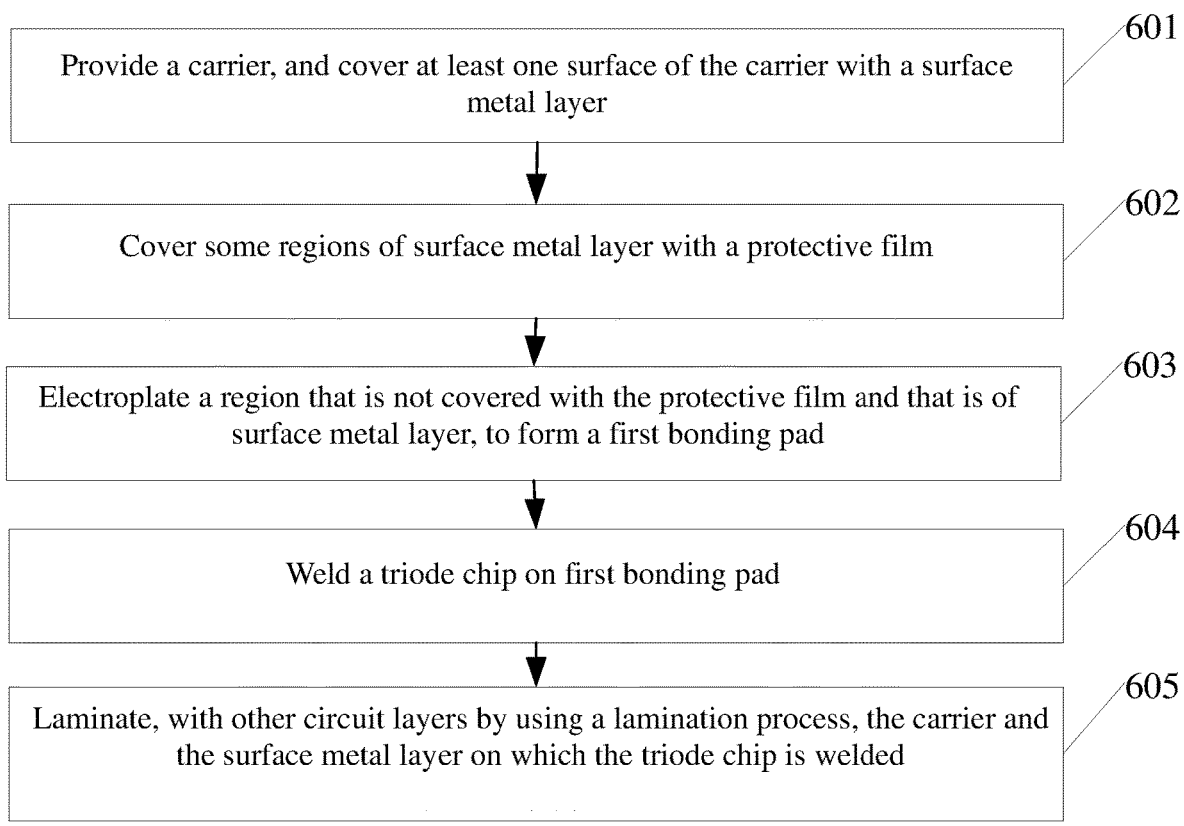
FIG. 6 is a schematic diagram of another embodiment of a triode packaging method according to the embodiments of the present invention.

FIG. 6 is a schematic diagram of another embodiment of a triode packaging method according to the embodiments of the present invention. A specific procedure of this embodiment is as follows:

Step 601. Provide a carrier, and cover at least one surface of the carrier with a surface metal layer.

Step 602. Cover some regions of the surface metal layer with a protective film.

Step 603. Electroplate a region that is not covered with the protective film and that is of the surface metal layer, to form a first bonding pad.

Step 604. Weld a triode chip on the first bonding pad.

Step 605: Laminate, with other circuit layers by using a lamination process, the carrier and the surface metal layer on which the triode chip is welded.

In this embodiment, during lamination, after the chip is mounted on the carrier, a resin board provided with a groove is positioned on the carrier (a portion corresponding to the chip is provided with a groove), an uppermost layer is copper foil, and the copper foil is etched to form a blind hole. The blind hole is connected to a circuit of the copper foil layer and a pad at an upper portion of the chip.

In this embodiment, the protective film is an anti-coating film;

the region that is not covered with the protective film is a conductive circuit region;

the conductive circuit region includes only a bonding pad, or the conductive circuit region includes a bonding pad and a connection cable;

the surface metal layer has a thickness of less than 7 μm, and an electroplated coating of the at least one bonding pad has a thickness of greater than 5 μm; and the welding a triode chip on the first bonding pad includes: there are two first bonding pads, and the two first bonding pads are respectively welded to one electrode of the triode chip;

or there is one first bonding pad, and the one first bonding pad is welded to one electrode of the triode chip.

In this embodiment, after the laminating, with other circuit layers by using a lamination process, the carrier and the surface metal layer on which the triode chip is welded, the method further includes:

connecting the other one or two electrodes of the triode to any one of the other circuit layers by using a blind hole process.

In this embodiment, after the laminating, with other circuit layers by using a lamination process, the carrier and the surface metal layer on which the triode chip is welded, the method further includes:

stripping the carrier from a bottom portion of the surface metal layer; and etching the surface metal layer, where the region that is covered with the protective film and that is of the surface metal layer is etched; the surface metal layer whose region is not covered with the protective film is etched, or the surface metal layer whose region is not covered with the protective film and the electroplated conductive circuit region are reserved.

In this embodiment, the carrier is a laminate with two-layer copper foil, an upper layer of the two-layer copper foil is ultrathin copper foil (having a thickness is less than 7 μm, where a preferable thickness ranges from 1 μm to 3 μm), a lower layer of the copper foil is conventional copper foil (having a thickness ranging from 10 μm to 50 μm, where a preferable thickness ranges from 30 μm to 40 μm), there is a certain viscosity between the two layers of copper foil, the two layers can also be relatively easily stripped, and the lower layer of the copper foil is closely combined with the laminate. The surface metal layer an ultrathin copper foil layer.

In addition, during actual production, two-layer copper foil may also exist on both sides of the laminate, to improve production efficiency.

In this embodiment, a method of using the ultrathin copper foil layer as an electroplating base layer for a bonding pad of a chip of a triode is used. The use of a laminate with two-layer copper foil as the carrier facilitates packaging of triodes in a circuit board production process. Applying a lamination process in a PCB production process to the packaging field greatly improves product efficiency, reduces a volume of a product obtained through packaging, and shortens a connection cable between the triode pad and the circuit.

Test data shows that the triode obtained through packaging by using the packaging method shown in FIG. 1 has a significantly smaller height than that of a triode obtained through packaging by using a traditional method, and used costs are also significantly reduced. The following is a test data table.

| Device model | | Dimensions in the industry (length * width * height) | Dimensions in the present invention (length * width * height) |
| --- | --- | --- | --- |
| MOSFET | DFN5 × 6 | 5.2 mm * 5.5 mm * 0.95 mm | 5.2 mm * 5.5 mm * 0.50 mm |
| | QFN3 × 3 | 3.1 mm * 3.3 mm * 0.85 mm | 3.1 mm * 3.3 mm * 0.50 mm |

It is apparent to those skilled in the art that the specific working process of the described system, apparatus, and unit may be referred to the corresponding process in the aforementioned method embodiments for convenience and conciseness of the description and is described again herein.

In the several embodiments provided in this application, it should be understood that the disclosed system, apparatus, and method may be implemented in another manner. For example, the apparatus embodiments described above are merely illustrative, for example, the division of the unit is merely a logical function division, in the actual implementation, the unit can be divided in other ways, for instance, a plurality of units or components can be combined or be integrated into another system, or some features can be omitted or not implemented. On the other side, the illustrated or discussed coupling or direct coupling or communication connection between each other may be through some interfaces, the indirect coupling or communication connection of the apparatus or unit can be electrical, mechanical or in other forms.

The elements described as separate components may or may not be physically separated, and the components displayed as units may or may not be physical units, that is, the components can be arranged in one position or be distributed on a plurality of network units. Some or all of the units may be selected according to actual needs to realize the purpose of the scheme of the present embodiment.

In addition, the functional units in the embodiments of the present invention can be integrated in one processing unit or each unit may independently physically exist, or two or more units may be integrated into one unit. The integrated units can be implemented in the form of hardware, and can also be implemented in the form of a software functional unit.

If the integrated units are implemented in the form of a software functional unit and sold or used as an independent product, they can be stored in a computer-readable storage medium. Based on the understanding, the technical schemes of the present invention in essence illustrate the part contributing to the prior art or the whole or the part of the technical schemes in the form of a software product, the computer software product is stored in a storage medium, including some instructions for making a computer device (personal computer, server or network device and the like) implement all or part of the steps of the methods in the embodiments of the present invention. The foregoing storage media include: a USB flash drive, a removable hard disk, a read-only memory (ROM), a random access memory (RAM), a magnetic disk, an optical disk, or other media that can store program code.

As mentioned above, the above embodiments are only used to describe the technical solutions of the present invention, instead of limiting the technical solutions. Although the present invention has been described in detail with reference to the foregoing embodiments, those of ordinary skill in the art should understand that they can still modify the technical solutions described in the embodiments, or equivalently replace some of the technical features. However, these modifications or replacements do not deviate the essence of the corresponding technical solutions from the spirit and scope of the technical solutions of the embodiments of the present invention.

What is claimed is:

1. A triode packaging method, comprising:
   providing a carrier, and covering at least one surface of the carrier with a surface metal layer;
   covering some regions of the surface metal layer with a protective film;
   electroplating a region that is not covered with the protective film and that is of the surface metal layer to form at least one first bonding pad;
   welding a chip on the at least one first bonding pad;
   welding a second bonding pad on the chip to form a triode template;
   performing a plastic packaging on the triode template by using a composite material;
   drilling blind holes in a vertical direction of the second bonding pad and the at least one first bonding pad, and processing the blind holes into metallic blind holes; and
   performing a pattern fabrication on the metallic blind holes to form a closed-circuit loop or a non-closed-circuit loop, and obtaining a triode through packaging.

2. The triode packaging method according to claim 1, wherein
   the protective film is an anti-coating film;
   the region that is not covered with the protective film is a conductive circuit region;
   the conductive circuit region comprises only a bonding pad, or the conductive circuit region comprises a bonding pad and a connection cable;
   the surface metal layer has a thickness of less than 7 µm, and an electroplated coating of the at least one first bonding pad has a thickness of greater than 5 µm;
   welding the chip on the at least one first bonding pad comprises: providing two first bonding pads, wherein the two first bonding pads are respectively welded to one electrode of the chip; or providing one first bonding pad, wherein the one first bonding pad is welded to one electrode of the chip; and
   welding the second bonding pad on the chip to form a triode template comprises: the second bonding pad being located at the other two electrodes or the other one electrode of the chip.

3. The triode packaging method according to claim 2, wherein the triode packaging method further comprises:
   stripping the carrier from a bottom portion of the surface metal layer;
   etching the surface metal layer, wherein the region covered with the protective film and that is of the surface metal layer is etched; the surface metal layer whose region is not covered with the protective film is etched, or the surface metal layer whose region is not covered with the protective film and the electroplated conductive circuit region are reserved, wherein,
   the carrier is a laminate with two-layer copper foil, an upper layer of the two-layer copper foil is a surface metal layer, a lower layer of the two-layer copper foil is copper foil with a thickness of 10 µm to 50 µm, with a certain viscosity between the two-layer copper foil, wherein the two-layer copper foil can also be relatively easily stripped, and the lower layer of the two-layer copper foil is closely combined with the laminate.

4. The triode packaging method according to claim 1, wherein
   covering the some regions of the surface metal layer with the protective film comprises:
   covering a circuit pattern region of the surface metal layer with a resist film; and
   electroplating the region that is not covered with the protective film and that is of the surface metal layer comprises: electroplating a non-circuit pattern region of the surface metal layer.

5. The triode packaging method according to claim 4, wherein covering the circuit pattern region of the surface metal layer with the resist film comprises:
   coating the surface metal layer with the resist film; and
   removing the resist film of the non-circuit pattern region by using exposure and development steps, so that a reserved resist film covers the circuit pattern region.

6. The triode packaging method according to claim 5, wherein before welding the chip on the at least one first bonding pad, the triode packaging method further comprises:
   removing the reserved resist film of the circuit pattern region.

7. The triode packaging method according to claim 4, wherein welding the chip on the at least one first bonding pad comprises:
   placing the chip on the at least one first bonding pad, and welding the chip on the at least one first bonding pad in at least one manner of solder paste, tin plating, metal bonding, and conductive adhesive bonding.

8. The triode packaging method according to claim 4, wherein drilling the blind hole in the vertical direction of the second bonding pad comprises:
   drilling the blind hole in the vertical direction of the second bonding pad by using a laser blind hole; and
   processing the blind holes into the metallic blind holes comprises:

processing the blind holes into the metallic blind holes in at least one manner of electroless plating copper, electrocoppering, sputtered copper, and a conductive copper adhesive.

9. The triode packaging method according to claim 4, wherein after performing pattern fabrication on the metallic blind holes to form the closed-circuit loop or the non-closed-circuit loop, the triode packaging method further comprises:
adding the composite material to a mold and performing the plastic packaging to cut off an excess composite material.

10. The triode packaging method according to claim 4, wherein the triode packaging method further comprises:
welding a target electronic component on the at least one first bonding pad, wherein the target electronic component comprises at least one of a resistor and a capacitor.

11. A triode, wherein the triode is a triode obtained through packaging by using the triode packaging method according to claim 1.

12. A triode, wherein the triode is a triode obtained through packaging by using the triode packaging method according to claim 2.

13. A triode, wherein the triode is a triode obtained through packaging by using the triode packaging method according to claim 4.

14. A triode, wherein the triode is a triode obtained through packaging by using the triode packaging method according to claim 9.

15. A triode packaging method, comprising:
providing a carrier, and covering at least one surface of the carrier with a surface metal layer;
covering some regions of the surface metal layer with a protective film;
electroplating a region that is not covered with the protective film and that is of the surface metal layer to form a first bonding pad;
welding a triode chip on the first bonding pad; and
laminating with other circuit layers by using a lamination process, the carrier and the surface metal layer on which the triode chip is welded.

16. The triode packaging method according to claim 15, wherein
the protective film is an anti-coating film;
the region that is not covered with the protective film is a conductive circuit region;
the conductive circuit region comprises only a bonding pad, or the conductive circuit region comprises a bonding pad and a connection cable;
the surface metal layer has a thickness of less than 7 μm, and an electroplated coating of the at least one bonding pad has a thickness of greater than 5 μm; and
welding the triode chip on the first bonding pad comprises:
providing two first bonding pads, wherein the two first bonding pads are respectively welded to one electrode of the triode chip; or providing one first bonding pad, wherein the one first bonding pad is welded to one electrode of the triode chip.

17. The triode packaging method according to claim 16, after laminating with other circuit layers, the carrier and the surface metal layer on which the triode chip is welded, further comprising:
connecting other one or two electrodes of the triode chip to any one of the other circuit layers by using a blind hole process.

18. The triode packaging method according to claim 16, after laminating with other circuit layers, the carrier and the surface metal layer on which the triode chip is welded, further comprising:
stripping the carrier from a bottom portion of the surface metal layer;
etching the surface metal layer, wherein the region covered with the protective film and that is of the surface metal layer is etched; the surface metal layer whose region is not covered with the protective film is etched, or the surface metal layer whose region is not covered with the protective film and the electroplated conductive circuit region are reserved, wherein
the carrier is a laminate with two-layer copper foil, an upper layer of the two-layer copper foil is a surface metal layer, a lower layer of the two-layer copper foil is conventional copper foil with a thickness of 10 μm to 50 μm, a certain viscosity between the two-layer copper foil, wherein the two-layer copper foil can also be relatively easily stripped, and the lower layer of the two-layer copper foil is closely combined with the laminate.

19. A triode, wherein the triode is a triode obtained through packaging by using the triode packaging method according to claim 15.

20. A triode, wherein the triode is a triode obtained through packaging by using the triode packaging method according to claim 18.

* * * * *